(12) United States Patent
Nakamura

(10) Patent No.: US 6,528,395 B2
(45) Date of Patent: Mar. 4, 2003

(54) METHOD OF FABRICATING COMPOUND SEMICONDUCTOR DEVICE AND APPARATUS FOR FABRICATING COMPOUND SEMICONDUCTOR DEVICE

(75) Inventor: Takao Nakamura, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/818,309

(22) Filed: Mar. 27, 2001

(65) Prior Publication Data
US 2001/0055887 A1 Dec. 27, 2001

(30) Foreign Application Priority Data
Apr. 27, 2000 (JP) ......................... 2000-127150
Dec. 1, 2000 (JP) ......................... 2000-367050

(51) Int. Cl.$^7$ ................ H01L 21/306; C23C 16/00
(52) U.S. Cl. ............ 438/478; 438/503; 438/504; 438/607; 438/749; 438/931; 118/715; 118/719; 118/723
(58) Field of Search ................ 118/715, 719, 118/723; 427/585, 586, 587; 438/478, 503, 504, 607, 749, 931

(56) References Cited

U.S. PATENT DOCUMENTS 5,709,745 A * 1/1998 Larkin et al. ............. 117/96
6,165,874 A * 12/2000 Powell et al. ............. 438/478
6,349,669 B1 * 2/2002 Matsumura et al. ....... 118/723

FOREIGN PATENT DOCUMENTS

| JP | 62 247577 | 10/1987 |
|---|---|---|
| JP | 01 214017 | 8/1989 |
| JP | 01-239846 | 9/1989 |
| JP | 04 184980 | 7/1992 |
| JP | 05 335267 | 12/1993 |
| JP | 06 045588 | 2/1994 |
| JP | 06 232100 | 8/1994 |
| JP | 09 055365 | 2/1997 |
| JP | 09 255499 | 9/1997 |
| JP | 10-036199 | 2/1998 |
| JP | 10-112556 | 4/1998 |

* cited by examiner

Primary Examiner—David Nelms
Assistant Examiner—Reneé R Berry
(74) Attorney, Agent, or Firm—W. F. Fasse; W. G. Fasse (57) ABSTRACT

A method of fabricating a compound semiconductor device having an ohmic electrode of a low contact potential includes a first cleaning step of heating a compound semiconductor substrate containing a first conductivity type impurity in a temperature range of not more than 250° C. and etching its surface with hydrogen chloride at the temperature of not more than 250° C., and a second cleaning step of performing a radical hydrotreatment on the compound semiconductor substrate at a temperature not more than 250° C., after the first cleaning step. The first cleaning step removes an oxide film but leaves chlorine on the surface of the substrate. The second cleaning step removes the chlorine. The temperature of not more than 250° C. avoids damaging other layers such as an active layer on the opposite surface of the substrate. A compound semiconductor film with a higher impurity concentration, and then a Ti or Au electrode film are formed on the cleaned substrate surface to provide an ohmic backside electrode.

21 Claims, 9 Drawing Sheets

METHOD OF FABRICATING COMPOUND SEMICONDUCTOR DEVICE AND APPARATUS FOR FABRICATING COMPOUND SEMICONDUCTOR DEVICE

BACKGROUND OF THE INVENTION

1. Field of the Invention

The present invention relates to a method of fabricating a compound semiconductor device employed for an LED (light emitting diode) or the like and an apparatus for fabricating a compound semiconductor device, and more particularly, it relates to a method of fabricating a semiconductor device for a ZnSe-based LED employed for the backlight of a liquid display unit or the like and an apparatus for fabricating a compound semiconductor device.

2. Description of the Prior Art

In order to drive a compound semiconductor device such as an LED, it is necessary to form an electrode on a compound semiconductor. For example, an electrode of ohmic contact must be formed on the back surface of a ZnSe substrate, in order to produce a ZnSe-based LED chip. However, such an electrode of ohmic contact cannot be readily formed on the ZnSe substrate for the following reasons:

(a) The upper bound of the carrier concentration of the ZnSe substrate is limited to the latter half of the $10^{17}$ mark. No ZnSe substrate having a carrier concentration exceeding the latter half of the $10^{17}$ mark has heretofore been fabricated. In particular, the carrier concentration of a p-type ZnSe substrate cannot even reach the $10^{17}$ mark.

(b) Oxides are readily formed on the surface of the substrate.

(c) The treatment temperature for forming the electrode must be not more than 250° C., in order to protect an active layer or a cladding layer of an emission part.

In general, In which is a low melting point metal is known as an electrode metal implementing ohmic contact. An electrode of ohmic contact can be formed also on the aforementioned ZnSe substrate by fusing In.

In a ZnSe-based LED prepared by fusing In, however, various inconveniences result from the low melting point of In in solder reflow or transfer molding. When the ZnSe-based LED is heated to 200° C. to 250° C., for example, ball-up results from the low melting point of In of about 157° C., and hence a flat interface cannot be obtained. Therefore, uniform ohmic contact cannot be attained despite implementation of partial ohmic contact. When a flat electrode having ohmic contact is not formed, an unnecessarily high voltage must be applied to the overall LED, which in turn requires a large number of batteries and cannot be readily applied to the backlight for a liquid crystal display screen of a portable telephone or the like. Thus, strongly awaited is development of an electrode, not prepared from In, capable of attaining thermally and mechanically stable ohmic contact with a compound semiconductor.

SUMMARY OF THE INVENTION

An object of the present invention is to provide a method of fabricating a compound semiconductor device having an electrode attaining stable ohmic contact with a compound semiconductor without employing a low melting point metal such as In and an apparatus for fabricating a compound semiconductor device.

The method of fabricating a compound semiconductor device according to the present invention comprises a substrate cleaning step including a first cleaning step of heating a compound semiconductor substrate containing a first conductivity type impurity in a temperature range of not more than 250° C. for etching its surface with hydrogen chloride and a second cleaning step of performing a radical hydrotreatment on the compound semiconductor substrate etched with hydrogen chloride after the first cleaning step.

When etching the surface of the compound semiconductor substrate with hydrogen chloride, an oxide film resulting from atmospheric exposure can be removed. In this hydrogen chloride etching, the temperature of the compound semiconductor substrate must be not more than 250° C., in order to prevent damage of an active layer and a cladding layer already formed on the opposite surface of the compound semiconductor substrate. When performing the hydrogen chloride treatment at a temperature of not more than 250° C., the surface of the compound semiconductor substrate adsorbs Cl although the oxide film or a carbide can be removed from this surface. Therefore, the radical hydrotreatment is performed for removing the adsorbed Cl. Cl can be removed by the radical hydrotreatment. Radical hydrogen has high reaction activity, and hence a sufficiently high radical hydrogenation reaction rate can be ensured also when setting the temperature of the compound semiconductor substrate to not more than 250° C. A clean surface of a compound semiconductor can be obtained also at a temperature of not more than 250° C. due to the hydrogen chloride treatment and the radical hydrotreatment, so that an epitaxial compound semiconductor film can be formed without forming interfacial levels. The compound semiconductor substrate includes not only the bare substrate in the initial stage of the treatments but also the compound semiconductor substrate formed with a thin film such as an optical active layer in the process of the treatments. The present invention is mainly directed to a case of forming an ohmic electrode layer on the back surface of a compound semiconductor substrate already formed with an optical active layer or the like on its surface without damaging the optical active layer or the like.

The method of fabricating a compound semiconductor device according to the present invention can further comprise a compound semiconductor film forming step of epitaxially growing a compound semiconductor film containing the first conductivity type impurity in a higher concentration than the compound semiconductor substrate on the compound semiconductor substrate after the cleaning step and a conductive electrode film forming step of forming a conductive electrode film on the compound semiconductor film.

When directly forming a conductive electrode layer of a material other than In on the compound semiconductor substrate, ohmic contact cannot be attained if the compound semiconductor substrate has a low carrier concentration. Therefore, the compound semiconductor film containing a conductive impurity in a higher concentration than the compound semiconductor substrate is epitaxially grown for forming the conductive electrode film on the epitaxial film having a high carrier concentration and ensuring ohmic contact. If merely performing cleaning by general etching after exposing the surface of the compound semiconductor substrate to the atmosphere, a desired compound semiconductor film cannot be obtained due to a large quantity of impurities remaining on the surface. Therefore, when performing film formation at a low temperature of not more than 250° C., for example, an epitaxial film having a high carrier concentration cannot be obtained with a small number of interfacial levels on the surface of the compound semiconductor substrate.

If the interface between the compound semiconductor film and the conductive electrode film is not clean, large interfacial resistance is formed to cause such large potential difference on the interface that ohmic contact is not implemented, or voltage applied to the overall LED cannot be reduced even if ohmic contact is implemented. According to the aforementioned structure of the present invention, a highly clean surface can be obtained on the back side of the compound semiconductor substrate without damaging an optical active layer or the like already formed on its surface, for readily forming an electrode of ohmic contact thereon.

An active layer and a cladding layer serving as emission parts are formed on another surface of an n-type ZnSe substrate. The active layer and the cladding layer stably emit blue light, while the ZnSe substrate receiving this blue light emits yellow light. Therefore, highly stable white light can be obtained through the low-priced compound semiconductor device. According to the present invention, the electrode of ohmic contact is provided on the back surface of the aforementioned n-type ZnSe substrate for reducing a contact potential, thereby enabling reduction of the number of batteries necessary for the backlight of a liquid crystal display unit for a portable terminal or the like.

The aforementioned method of fabricating a compound semiconductor device according to the present invention can carry out treatments in the compound semiconductor film forming step and the conductive electrode film forming step within such a temperature range that the temperature of the compound semiconductor substrate is not more than 250° C.

Thus, the electrode layer of ohmic contact can be readily formed on the back surface of the compound semiconductor substrate without damaging an active layer or the like already formed on the surface of the compound semiconductor substrate.

In the aforementioned method of fabricating a compound semiconductor device according to the present invention, treatments in the substrate cleaning step, the compound semiconductor film forming step and the conductive electrode film forming step are preferably continuously carried out without exposing the compound semiconductor substrate to the atmosphere, for example.

If both of the interface between the compound semiconductor substrate and the compound semiconductor film and that between the compound semiconductor film and the conductive electrode film are not cleaned, large interfacial resistance is formed to cause large potential difference on the interfaces. If the interface between the compound semiconductor substrate and the compound semiconductor film is exposed to the atmosphere, the effects of the hydrogen chloride treatment and the radical hydrotreatment are reduced by half. The interface between the compound semiconductor film and the conductive electrode film tends to be exposed to the atmosphere. When exposed to the atmosphere, the interface is contaminated with oxides or carbon and hence ohmic contact is hard to implement or voltage applied to the overall LED cannot be reduced even if ohmic contact is implemented. When the compound semiconductor device is used as the backlight of a liquid crystal display unit for a portable terminal, therefore, the number of necessary batteries cannot be reduced. Ohmic contact of low resistance can be implemented by continuously forming the compound semiconductor film and the conductive electrode film on the clean surface of the substrate and the compound semiconductor film respectively without atmospheric exposure, as described above.

In the aforementioned method of fabricating a compound semiconductor device according to the present invention, treatments in the substrate cleaning step, the compound semiconductor film forming step and the conductive electrode film forming step are preferably carried out in respective treatment chambers of a treatment apparatus having a plurality of treatment chambers coupled with each other by an ultrahigh vacuum transfer path respectively without exposing the compound semiconductor substrate to the atmosphere between the treatments, for example.

The compound semiconductor substrate can be heated to a temperature of not more than 250° C. not damaging the optical active layer or the like without atmospheric exposure, for obtaining a clean surface in an assembly-line manner and forming the electrode film of ohmic contact. Thus, the electrode film of ohmic contact can be extremely readily formed on the back surface of the compound semiconductor substrate, for improving the fabrication yield of an LED emitting white light, for example, and reducing the fabrication cost.

In the aforementioned method of fabricating a compound semiconductor device according to the present invention, the first cleaning step can be carried out under conditions of (a) gas components 5 to 20 volume % of HCl and a rest of He gas, and (b) gas pressure of $1 \times 10^{-6}$ Torr to $1 \times 10^{-4}$ Torr, for example.

The surface of the compound semiconductor substrate is positively etched due to the aforementioned hydrogen chloride cleaning, so that oxides are removed. Thus, one condition for epitaxially growing a high-concentration carrier film is satisfied. In relation to the gas composition with the rest of He gas, oxides are insufficiently removed if the content of HCl is less than 5 volume %, while the etched surface is not flattened if the content exceeds 20 volume %. Further, the etching rate is so small that etching is practically impossible if the total gas pressure is less than $1 \times 10^{-6}$ Torr in the aforementioned gas composition, while etching is ununiformly performed to deteriorate surface flatness if the gas pressure exceeds $1 \times 10^{-4}$ Torr. If the substrate temperature exceeds 250° C., further, the performance of a portion formed as the active layer etc. of the LED is damaged.

In the aforementioned method of fabricating a compound semiconductor device according to the present invention, hydrogen radicalization in the second cleaning step can be carried out under conditions of (a) hydrogen pressure of $5 \times 10^{-7}$ Torr to $5 \times 10^{-4}$ Torr, and (b) radicalization power of 50 to 300 W, for example.

Adsorbed Cl can be removed for obtaining a clean surface by the radical hydrotreatment carried out at a temperature of not more than 250° C. under the aforementioned conditions.

In the aforementioned method of fabricating a compound semiconductor device according to the present invention, the compound semiconductor substrate can be an n-type ZnSe substrate containing an n-type impurity of at least $1 \times 10^{17}/cm^3$, for example, the compound semiconductor film can be an n+-type ZnSe film containing an n-type impurity of at least $1 \times 10^{19}/cm^3$, and the conductive electrode film can include a Ti film in contact with the n$^+$-type ZnSe film and a protective film protecting the Ti film.

An active layer and a cladding layer serving as emission parts are formed on the other surface of the n-type ZnSe substrate. The active layer etc. stably emit blue light, while the ZnSe substrate receiving this blue light emits yellow light. Therefore, highly stable white light can be obtained through the low-priced compound semiconductor device. The electrode of ohmic contact according to the present invention is provided on the back surface of the aforementioned n-type ZnSe substrate for reducing a contact potential, thereby enabling reduction of the number of batteries necessary for the backlight of a liquid crystal display unit for a portable terminal or the like. Electric resistance can be reduced by setting the n-type impurity concentration in the n-type ZnSe substrate to at least $1 \times 10^{17}/cm^3$, while ohmic contact can be implemented by setting the n-type impurity concentration of the $n^+$-type ZnSe film to at least $1 \times 10^{19}/cm^3$. If the n-type impurity concentration of the $n^+$-type ZnSe film is less than $1 \times 10^{19}/cm^3$, ohmic contact cannot be attained between this film and a conductive layer such as the Ti film but interfacial resistance is disadvantageously increased. If the n-type impurity concentration in the n-type ZnSe substrate is less than $1 \times 10^{17}/cm^3$, electric resistance is disadvantageously increased. Such increase of the resistance increases the number of necessary batteries, to increase the weight of and the cost for the compound semiconductor device.

Ti readily implements ohmic contact with respect to the compound semiconductor film containing the aforementioned first conductivity type impurity, such as an n-type impurity, for example, in a high concentration. Therefore, the Ti film is formed to implement ohmic contact, and a chemically stable Au film, for example, is formed on the active Ti film.

The apparatus for fabricating a compound semiconductor device according to the present invention comprises a gas treatment apparatus performing gas etching on a compound semiconductor substrate, a radical treatment chamber performing a radical treatment on the compound semiconductor substrate, a film formation treatment apparatus forming a compound semiconductor film on the compound semiconductor substrate and a conductive film forming apparatus forming a conductive film on the compound semiconductor substrate, and further comprises an ultrahigh vacuum transfer path coupled with the respective ones of the gas treatment apparatus, the radical treatment apparatus, the film formation treatment apparatus and the conductive film forming apparatus to be capable of transferring the compound semiconductor substrate.

It is possible to continuously perform a hydrogen chloride treatment and a radical hydrotreatment in an ultrahigh vacuum, reduce interfacial resistance and form an epitaxial compound semiconductor film by employing the treatment apparatus having the aforementioned structure. The ultrahigh vacuum is a vacuum of less than $10^{-8}$ Torr. The compound semiconductor device according to the present invention can be fabricated only by the fabrication apparatus having the aforementioned structure.

In the aforementioned apparatus for fabricating a compound semiconductor device according to the present invention, the gas treatment apparatus can include a hydrogen chloride treatment apparatus etching the compound semiconductor substrate with hydrogen chloride, for example.

Oxygen and carbon adhering to the surface of the compound semiconductor substrate can be removed by positively etching the compound semiconductor substrate with the hydrogen chloride treatment apparatus connected by the ultrahigh vacuum transfer path, for moving the compound semiconductor substrate to a next step in the ultrahigh vacuum.

In the aforementioned apparatus for fabricating a compound semiconductor device according to the present invention, the radical treatment apparatus can include a radical hydrotreatment apparatus performing a radical hydrotreatment on the compound semiconductor substrate, for example.

When performing the hydrogen chloride treatment at a temperature of not more than 250° C., Cl is absorbed on the compound semiconductor substrate to form interfacial levels when the compound semiconductor film is formed on the compound semiconductor substrate. Therefore, the radical hydrotreatment is carried out after the hydrogen chloride treatment while moving the compound semiconductor in the ultrahigh vacuum without atmospheric exposure, thereby removing Cl so that a clean surface appears and an epitaxial film can be formed without interfacial levels.

The aforementioned apparatus for fabricating a compound semiconductor device according to the present invention can have an MBE (molecular beam epitaxial) apparatus serving both as the radical hydrotreatment apparatus and the film formation treatment apparatus, for example, and the MBE apparatus can include a Zn cell, an Se cell, a $ZnCl_2$, cell, a hydrogen gas supply source and a radicalization gun for performing a radical hydrotreatment on the compound semiconductor substrate with the hydrogen gas supply source and the radicalization gun and forming an n-type ZnSe film on the compound semiconductor substrate with the Zn cell, the Se cell and the $ZnCl_2$, cell.

A highly clean surface of the compound semiconductor substrate can be obtained due to the aforementioned structure, so that an epitaxial $n^+$-type ZnSe film having a high carrier concentration can be formed thereon. Thus, it is possible to implement ohmic contact with respect to a substrate whose carrier concentration can be increased to merely the latter half of the $10^{17}$ mark.

In the aforementioned apparatus for fabricating a compound semiconductor device according to the present invention, the conductive film forming apparatus can form at least one of a Ti film and an Au film on the compound semiconductor substrate.

A back electrode implementing ohmic contact with respect to the compound semiconductor device can be formed due to the aforementioned structure.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
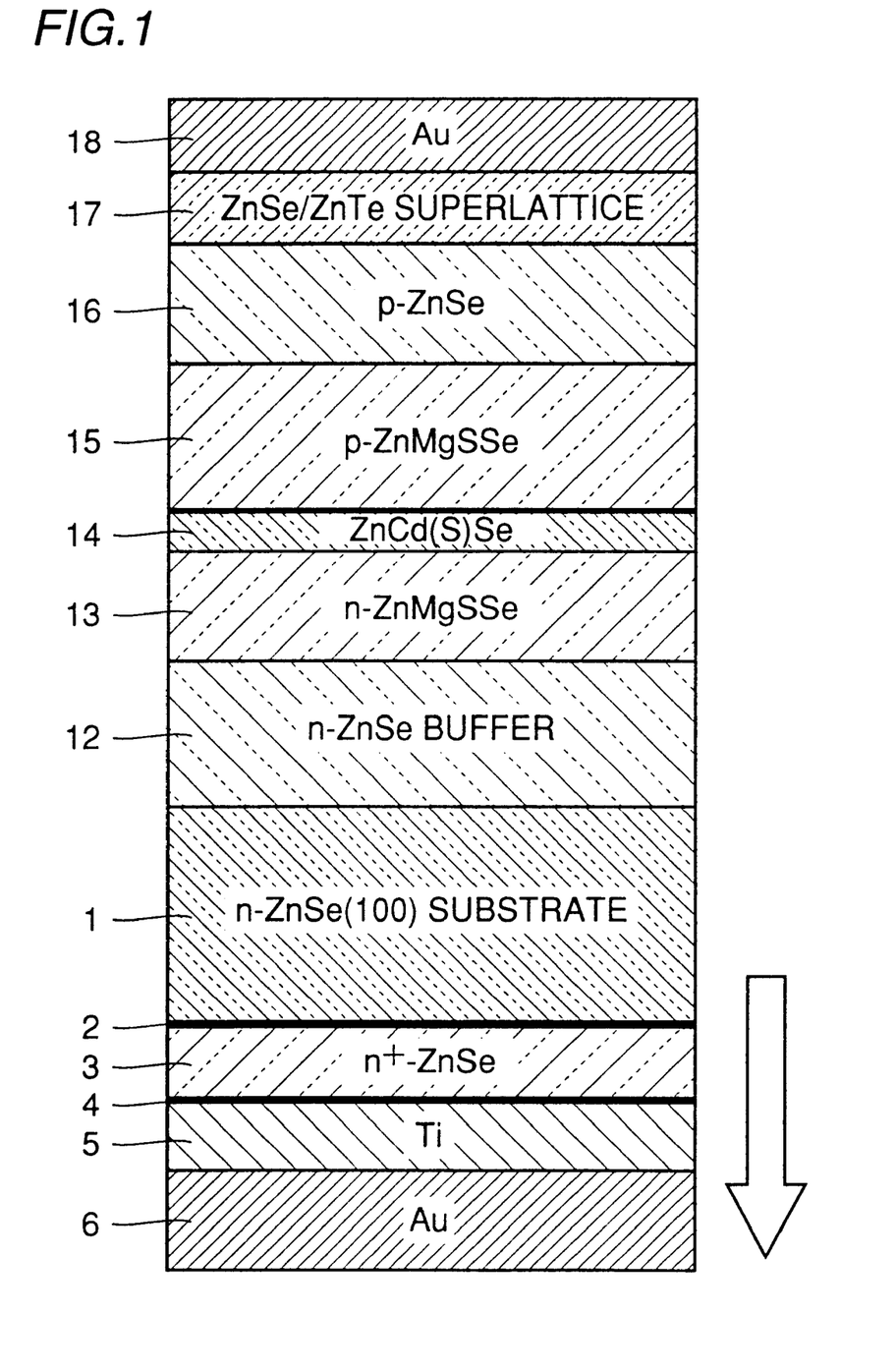
FIG. 1 is a sectional view schematically showing the structure of a compound semiconductor device according to an embodiment of the present invention.

An embodiment of the present invention is now described with reference to the drawings. Referring to FIG. 1, an n-type ZnSe layer 12, an n-type ZnMgSSe cladding layer 13, a ZnCdSe active layer 14, a p-type ZnMgSSe layer 15, a p-type ZnSe layer 16 and a superlattice layer 17of a ZnSe film and a ZnTe film are formed on an n-type ZnSe substrate 1 successively from below, and an Au film 18 is provided on the superlattice layer 17 as an upper electrode. An $n^+$-type ZnSe film 3 having a high carrier concentration is formed on the back surface of the n-type ZnSe substrate 1 through an interface 2, in order to implement ohmic contact. A Ti film 5, which is a conductive layer, and an Au film 6 are further formed on the $n^+$-type ZnSe film 3 through an interface 4. The Ti film 5 is formed for readily attaining ohmic contact, and the Au film 6 is formed for protecting the Ti film 5 readily reacting with the atmosphere. In the aforementioned structure, the interfaces 2 and 4 are particularly important. According to the present invention, ohmic contact is attained on these interfaces 2 and 4, for reducing interfacial resistance.

EXAMPLE 1

Example 1 of the aforementioned embodiment of the present invention is now described.

1. Fabrication of Compound Semiconductor Device

Figure 2:
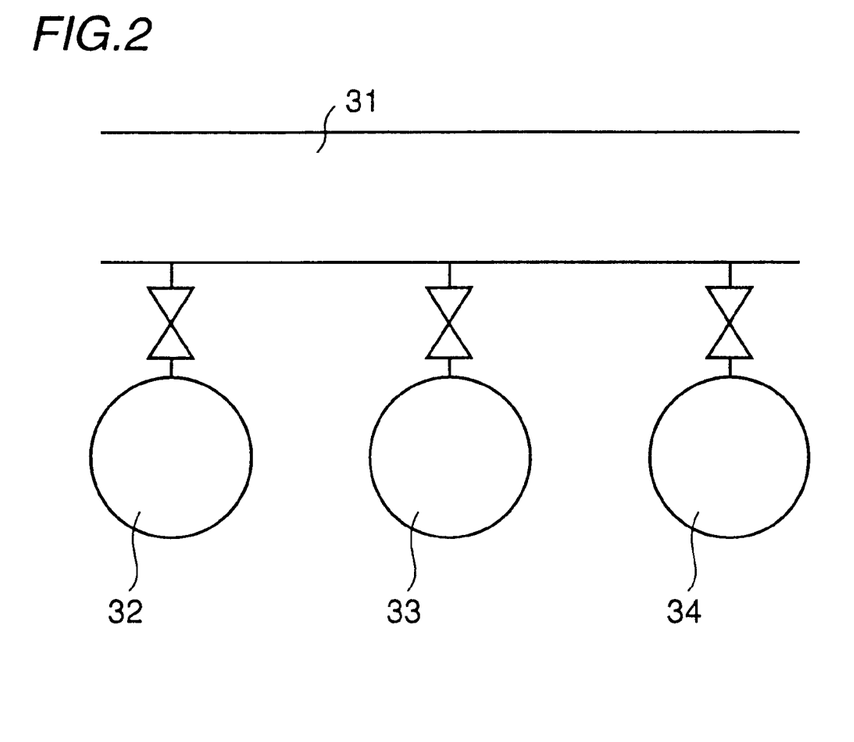
FIG. 2 schematically illustrates the structure of an apparatus for fabricating a compound semiconductor device in Example 1 of the embodiment of the present invention.

In the present invention, an apparatus for fabricating a compound semiconductor device plays an important role. FIG. 2 schematically shows the structure of the inventive apparatus for fabricating a compound semiconductor device. When forming thin films on the surface of an n-type ZnSe substrate, a series of processes of 1) cleaning the surface of the n-type ZnSe substrate, 2) forming an $n^+$-type ZnSe film having a high carrier concentration and 3) forming a conductive layer for an electrode can be continuously carried out in an ultrahigh vacuum of less than $10^{-8}$ Torr. In a gas treatment apparatus 3, a hydrogen chloride treatment of the ZnSe substrate is employed for the surface cleaning process before depositing the tin films, for removing oxygen and carbon from the surface of the substrate by etching. When performing this hydrogen chloride treatment at a temperature of not more than 250° C. for protecting an active layer, Cl adsorption results on the surface of the compound substrate. Therefore, the aforementioned apparatus moves the compound semiconductor substrate through an ultrahigh vacuum transfer path 31 and introduces the same into an MBE (molecular beam epitaxial) apparatus 33, for performing a radical hydrotreatment on the surface of the substrate subjected to the aforementioned hydrogen chloride treatment with a hydrogen supply source and a radicalization gun. A Cl adsorption layer is removed by this radical hydrotreatment. Thereafter an $n^+$-type ZnSe film having a high carrier concentration is formed in the MBE apparatus 33. Then, the substrate is moved through the ultrahigh vacuum transfer path 33 as such, for depositing a Ti layer which is a conductive layer and a protective layer therefor in situ in a deposition apparatus 34. Functions of the apparatuses 32, 33 and 34 shown in FIG. 2 are described below. It is important that the following apparatuses 32 to 34 are connected with each other through the ultrahigh vacuum transfer path 31.

(a) The hydrogen chloride treatment apparatus 32 supplies etching gas of 10 volume % of HCl/balance He from a nozzle.

(b) The MBE apparatus 33 is provided with Zn, Se, $ZnCl_2$ and $H_2$ supply sources and the radicalization gun.

(c) The deposition apparatus 34 includes Au and Ti sources and a mask mechanism for depositing Au and Ti.

Figure 3:
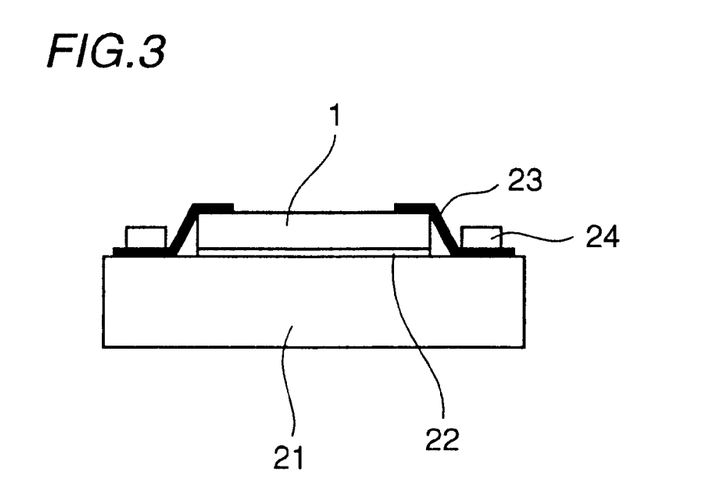
FIG. 3 is a sectional view showing the outline of a substrate holder for forming a back electrode of the compound semiconductor device.

An electrode was formed on an n-type ZnSe substrate 1 having a carrier concentration of the latter half of the $10^{17}$ mark prepared by CVT and cleaned with $K_2Cr_2O_7$/water. As shown in FIG. 3, the n-type ZnSe substrate 1 subjected to surface cleaning was placed on an Ar foil member 22 arranged on a substrate holder 21, and a Ta plate 23 covering its edge portion was pressed with screws 24 for mounting the substrate 1. Also when preparing an electrode on a device such as an LED, the surface of the device is protected with an Au foil member due to this holding method.

The prepared Au/Ti/$n^+$-type ZnSe/n-type ZnSe substrate 1 was cleaved to not more than 1 mm square, fused to a Cu/W block with In and annealed in $N_2$ gas at 250° C. for 2 minutes, for evaluating the prepared electrode. Electric characteristics were measured by current sweeping with a semiconductor parameter analyzer 4156 by Hewlett-Packard.

2. Hydrogen Chloride Treatment and Radical Hydrotreatment

Cleaning of the surface of the substrate is now described in detail. The features of hydrogen chloride etching reside in the following three points:

(1) The quantity of etching is larger as compared with radical hydrogen.

(2) An extremely smooth surface can be obtained.

(3) When setting the cleaning temperature (substrate temperature) to not more than 250° C., however, Cl is remarkably adsorbed on the surface of the ZnSe substrate. Therefore, hydrogen chloride cleaning is carried out under the following conditions:

(a) gas composition: 10 volume % of HCl/He balance (b) gas pressure: $2 \times 10^{-4}$ Torr (c) treatment temperature (substrate temperature): 250° C.

(d) treatment time: 20 minutes

With only such a hydrogen chloride treatment, however, no epitaxial film can be obtained also when forming an $n^+$-type ZnSe film later. This results from the aforementioned highly reactive Cl adsorption on the surface of the n-type ZnSe substrate caused by the hydrogen chloride treatment at a temperature of not more than 250° C. In order to eliminate this Cl adsorption, a radical hydrotreatment is effective. The radical hydrotreatment is carried out under the following conditions, for example:

(e) $H_2$ gas flow rate: 1 sccm (standard cubic centimeter/minute)

(f) $H_2$ pressure: $1.5 \times 10^{-5}$ Torr (g) radical power: 100 W (h) radicalization time: 20 minutes According to RHEED (reflection high energy electron diffraction) observation, the surface subjected to hydrogen chloride cleaning was (1×1) indicating a crystalline surface, while slight change from (1×1) to (2×2) indicating a clean surface was recognized due to the radical hydrotreatment. Table 1 shows results of analysis of AES (auger electron spectroscopy) on the surface of the n-type ZnSe substrate after the hydrogen chloride cleaning and the radical hydrotreatment.

TABLE 1

|  | Zn | Se | O | C | Cl | SE/Zn Ratio | Surface |
|---|---|---|---|---|---|---|---|
| 1) as received | 36.6 | 41.2 | 3.4 | 18.5 | 0.4 | 1.12 | C Contaminant and Oxide Present on Surface |
| 2) Hydrogen Chloride Treatment | 41.4 | 45.4 | 0.3 | 2.2 | 10.8 | 1.10 | C Contaminant and Oxide Reduced, Cl Adsorbed |
| 3) Radical Hydrotreatment | 43.7 | 51.9 | 0.4 | 2.2 | 1.7 | 1.19 | Adsorbed Cl Reduced |

*measurement error: 2%

The aforementioned analysis values are relative values (at.%) with reference to Zn, Se, O, C and Cl, and the Se/Zn ratios express atom number ratios of Se and Zn. From the results shown in Table 1, a model illustrated in FIG. 4 can be formed as to the aforementioned cleaning of the surface of the ZnSe substrate.

Figure 4:
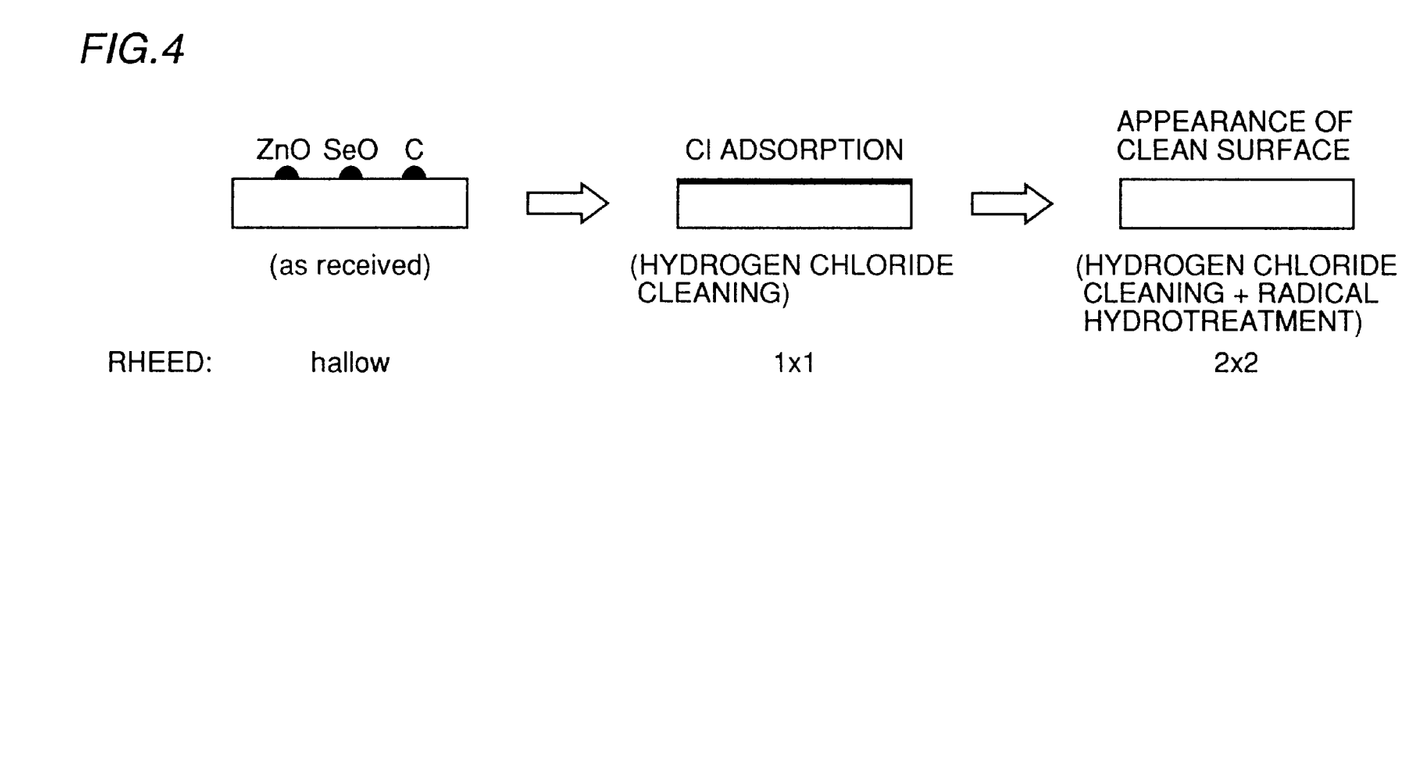
FIG. 4 is a model diagram showing the state of the surface of an n-type ZnSe substrate subjected to a hydrogen chloride treatment and a radical hydrotreatment.

(1) The surface of the ZnSe substrate is treated with hydrogen chloride for removing oxides and contaminants resulting from carbon from the surface by a thickness of about several nm.

(2) Thereafter the radical hydrotreatment is performed for removing Cl adsorbed on the surface of the ZnSe substrate over several layers.

After performing the aforementioned hydrogen chloride cleaning and the radical hydrotreatment, an $n^+$-type ZnSe film was formed and the interface between the n-type ZnSe substrate and the $n^+$-type ZnSe film was analyzed by SIMS (secondary ion mass spectrometry). Analysis values of impurities were at levels capable of ensuring ohmic contact having sufficiently low electric resistance.

3. Formation of High Carrier Concentration $n^+$ ZnSe Film

An $n^+$ ZnSe film is formed on the n-type ZnSe substrate subjected to the aforementioned hydrogen chloride cleaning-radical hydrotreatment. The $n^+$ ZnSe film containing an n-type impurity is formed by MBE by simultaneously irradiating the substrate with beams of Zn, Se and $ZnCl_2$. The quantity of doping can be adjusted by controlling a cell temperature of $ZnCl_2$. According to this embodiment, an $n^+$ ZnSe film having a high carrier concentration of the $10^{19}/cm^3$ mark can be obtained at a temperature of not more than 250° C. An epitaxial layer having excellent crystallinity can be formed by setting the $ZnCl_2$ cell temperature to about 123° C. and carrying out film formation at 250° C., also when increasing the carrier concentration to $5 \times 10^{19}/cm^3$. Excellent ohmic contact can be attained by forming a Ti film on the epitaxial $n^+$-type ZnSe film, due to the high carrier concentration of this film. The thickness of the $n^+$-type ZnSe film is preferably set to about 150 to 250 nm.

4. Formation of Conductive Layer

Following the aforementioned film formation, the substrate kept in the ultrahigh vacuum is moved in the ultrahigh vacuum transfer path to be introduced into the deposition apparatus, for forming a Ti film as the conductive layer and thereafter forming an Au film as the protective film for the Ti film as such. Thus, the substrate can be prevented from contamination with oxygen or carbon, dissimilarly to the case of being exposed to the atmosphere. In other words, the interface 4 shown in FIG. 1 can be cleaned for reducing interfacial resistance.

5. Current-Voltage Characteristic

Figure 5:
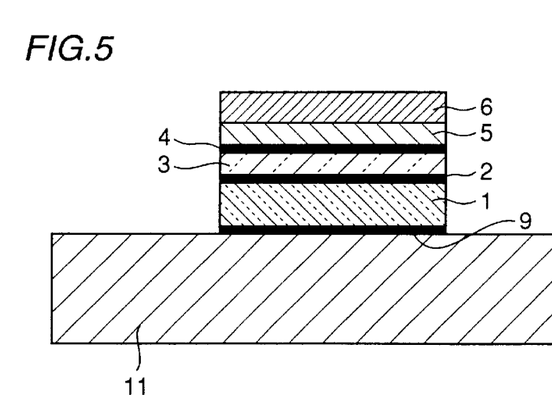
FIG. 5 is a sectional structure schematically showing a structure for measuring the current-voltage characteristic of the back electrode of the compound semiconductor device.
Figure 6:
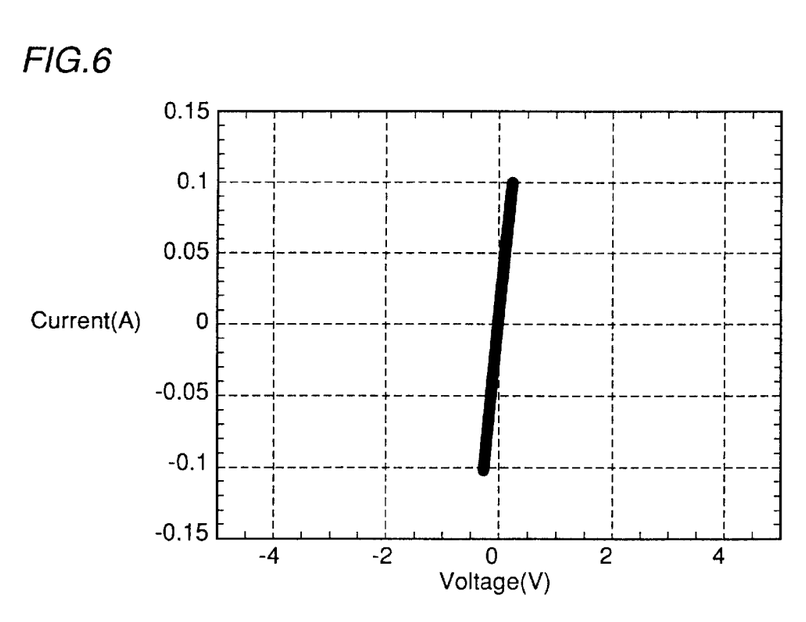
FIG. 6 illustrates the current-voltage characteristic of a back electrode of a ZnSe-based LED according to the present invention.
Figure 7:
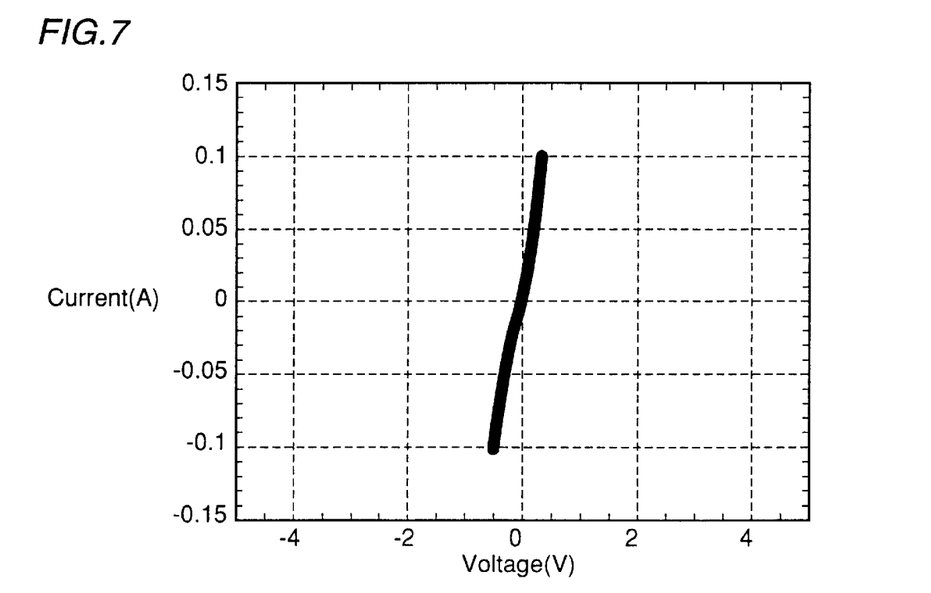
FIG. 7 illustrates the current-voltage characteristic of a back electrode prepared by forming a Ti film and an Au film without performing a radical hydrotreatment.

As to a sample shown in FIG. 5 prepared in the aforementioned manner, the current-voltage characteristic was measured over the vertical direction with the measuring apparatus described in the above item 1. Referring to FIG. 5, the sample is mounted on a Cu/W block 11 through an In layer 9. The size of the sample is 1 mm square. FIGS. 6 and 7 show influences exerted on the current-voltage characteristic by performance/non-performance of the radical hydrotreatment after the hydrogen chloride cleaning. Both of inventive and comparative samples shown in FIGS. 6 and 7 were transferred in ultrahigh vacuum transfer paths after formation of $n^+$ ZnSe films without atmospheric exposure, to be formed with Ti films and Au films. FIG. 6 shows the current-voltage characteristic of the inventive sample of a back electrode prepared by forming an $n^+$-type ZnSe film with no Cl adsorption layer, and thereafter forming a Ti film and an Au film. FIG. 7 shows the result of measurement of the comparative sample prepared by carrying out hydrogen chloride cleaning at 250° C. with no radical hydrotreatment, forming an $n^+$-type ZnSe film with Cl adsorption, and thereafter forming a Ti film and an Au film. As shown in FIG. 6, the inventive sample obtained a substantially linear current-voltage characteristic within the sweeping range of −100 mA to +100 mA. A voltage generated at 100 mA is 0.21 V. A voltage drop in the substrate and a voltage generated in the In electrode 9 can be estimated as about 0.05 V and about 0.08 V respectively from another measurement, and hence it is estimated that a voltage drop in the electrode of the aforementioned Au/Ti/n+-type ZnSe film is 0.08 V. In the comparative sample shown in FIG. 7, on the other hand, Cl adsorbed on the n-type ZnSe substrate influenced on formation of the $n^+$-type ZnSe film, to result in Schottky contact.

Figure 8:
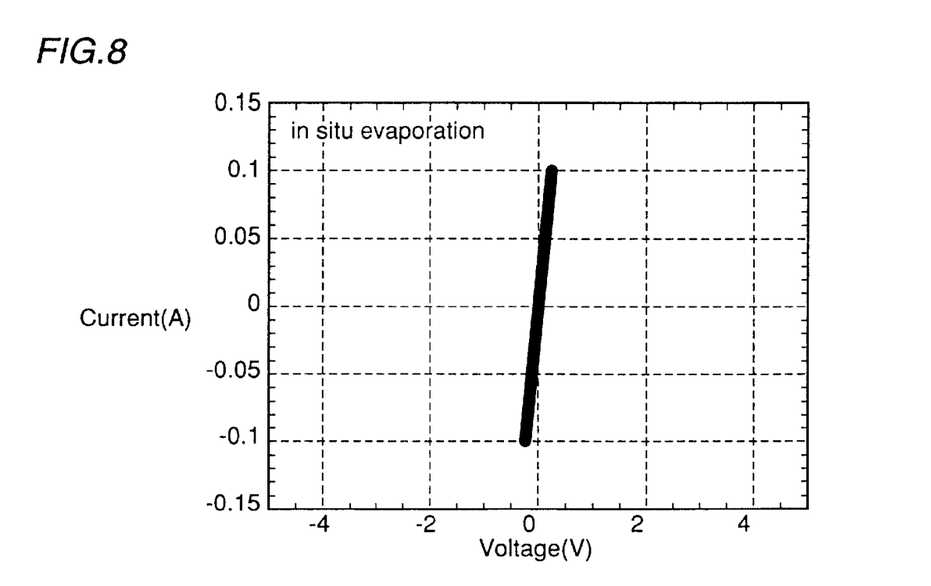
FIG. 8 illustrates the current-voltage characteristic of a back electrode of a ZnSe-based LED according to the present invention.
Figure 9:
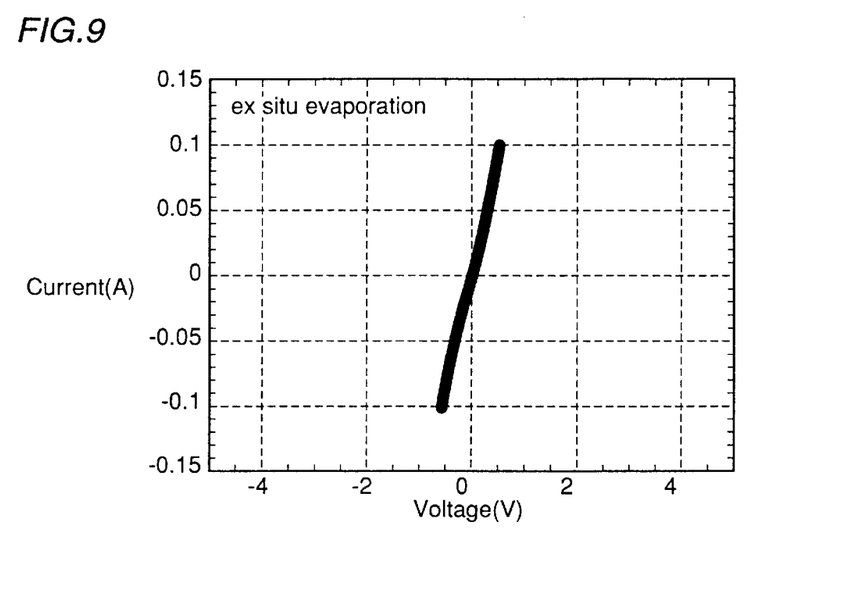
FIG. 9 illustrates the current-voltage characteristic of a back electrode prepared by forming a Ti film and an Au film with atmospheric exposure after forming an $n^+$ ZnSe film.

FIGS. 8 and 9 show the current-voltage characteristics of an electrode prepared by forming an $n^+$-type ZnSe film with no Cl adsorption and thereafter depositing a Ti film and an Au film in an ultrahigh vacuum as such and an electrode prepared by forming an n$^+$-type ZnSe film, thereafter exposing the same to the atmosphere and forming a Ti film and an Au film respectively. The thicknesses of the Ti and Au films are 50 nm. It is understood from FIG. 8 that the electrode prepared by forming the films in situ with no atmospheric exposure exhibits a linear current-voltage characteristic, to attain ohmic contact. A voltage drop in the Au/Ti/n$^+$-type ZnSe film of this electrode was 0.09 V. In the electrode prepared by forming a conductive layer after atmospheric exposure, on the other hand, the current-voltage characteristic was not linear but Schottky contact resulted as shown in FIG. 9.

As hereinabove described, an electrode of ohmic contact can be formed by employing an n-type ZnSe substrate, performing hydrogen chloride cleaning-radical hydrotreatment on its surface, forming an n$^+$-type ZnSe film and thereafter forming a conductive layer without atmospheric exposure. The electrode, having extremely low interfacial resistance of not more than 0.1 V, can be employed for the backlight of a liquid crystal display unit of a portable terminal for contributing to reduction of the number of batteries. Further, such electrodes can be supplied in a large quantity at a low cost without remarkably changing the conventional fabrication method.

EXAMPLE 2

Example 2 of the embodiment of the present invention is now described. Example 2 is basically similar to the methods of fabricating compound semiconductor devices according to the aforementioned embodiment and Example 1 thereof, except some conditions.

Figure 10:
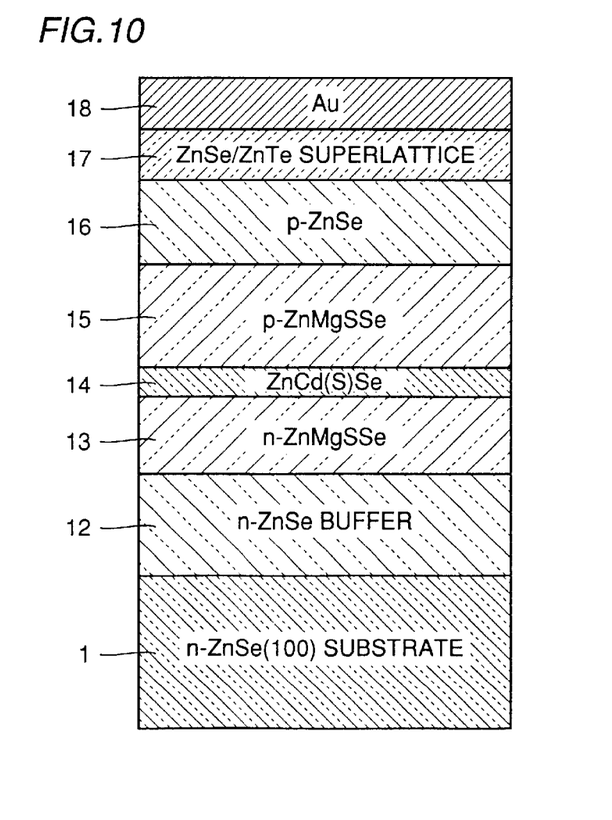
FIG. 10 is a sectional view showing a stage of forming an LED epitaxial multilayer film such as an active layer on the surface of an n-type ZnSe substrate in a method of fabricating a compound semiconductor device in Example 2 of the embodiment of the present invention.

(1) First, an LED epitaxial film including an emission active layer etc. was formed on the surface of an n-type ZnSe substrate, as shown in FIG. 10. This epitaxial film is identical to the multilayer film on the surface of the n-type ZnSe substrate shown in FIG. 1.

Figure 11:
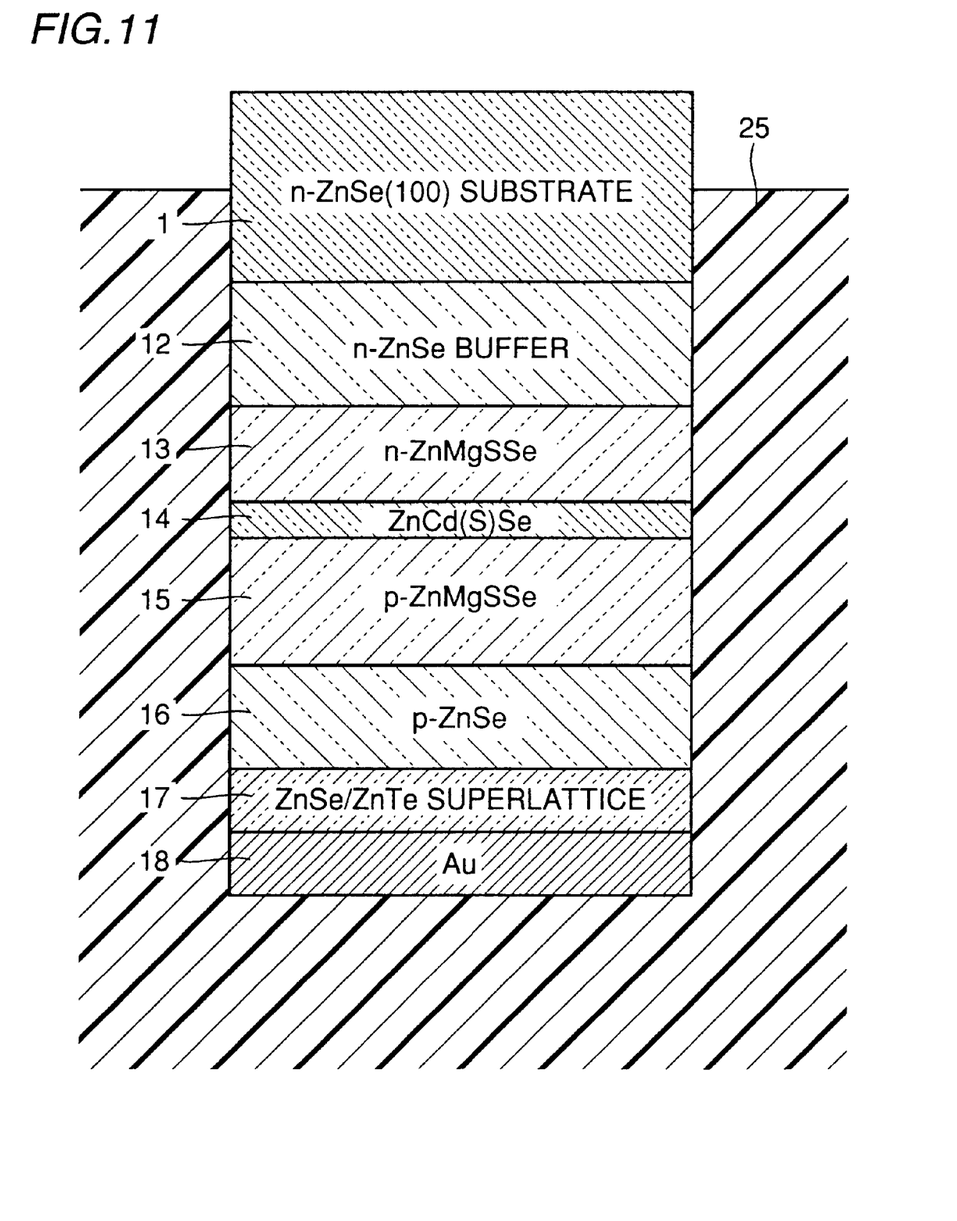
FIG. 11 is a sectional view showing a stage of bonding the n-type ZnSe substrate of the state shown in FIG. 10 to a glass substrate while polishing and etching the back surface.

(2) Then, the n-type ZnSe substrate formed with the LED epitaxial film was bonded to a glass substrate with wax 25, as shown in FIG. 11. Then, the back surface was back-lapped by a thickness of 250 $\mu$m.

(3) Thereafter etching was performed with a solution of $K_2CrO_7/H_2SO_4$, in order to remove distortion introduced by back-lapping (FIG. 11).

(4) In order to form an epitaxial film on the back surface of the n-type ZnSe substrate, the wax 25 was dissolved with acetone for detaching the ZnSe substrate from the glass substrate. Further, ultrasonic cleaning was performed with acetone.

(5) The ZnSe substrate was mounted on the substrate holder as shown in FIG. 3, in order to form the epitaxial film on the back surface thereof. A gold foil member was inserted between the n-type substrate and the substrate holder, for protecting the LED epitaxial film on the surface side and implementing excellent thermal contact.

(6) Then, the aforementioned n-type ZnSe substrate was mounted on the hydrogen chloride treatment apparatus 32 of the treatment apparatus shown in FIG. 2, and hydrogen chloride etching (first cleaning step) was performed on the back surface under the following conditions:

gas pressure: $2 \times 10^{-4}$ Torr etching time: 20 minutes substrate temperature: 225° C.

Figure 12:
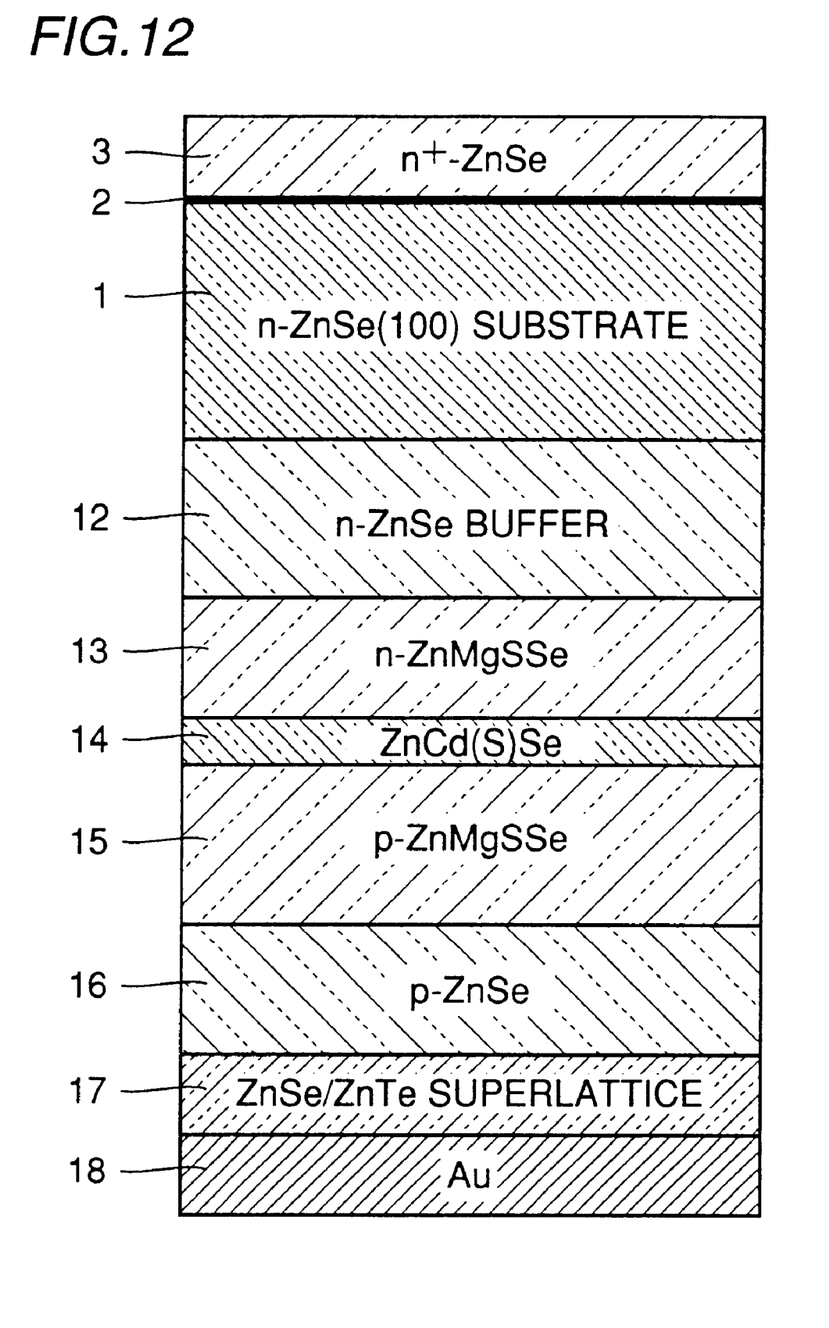
FIG. 12 is a sectional view showing a stage of forming an $n^+$-type ZnSe epitaxial film on the back surface of the n-type ZnSe substrate in the state shown in FIG. 11.
Figure 13:
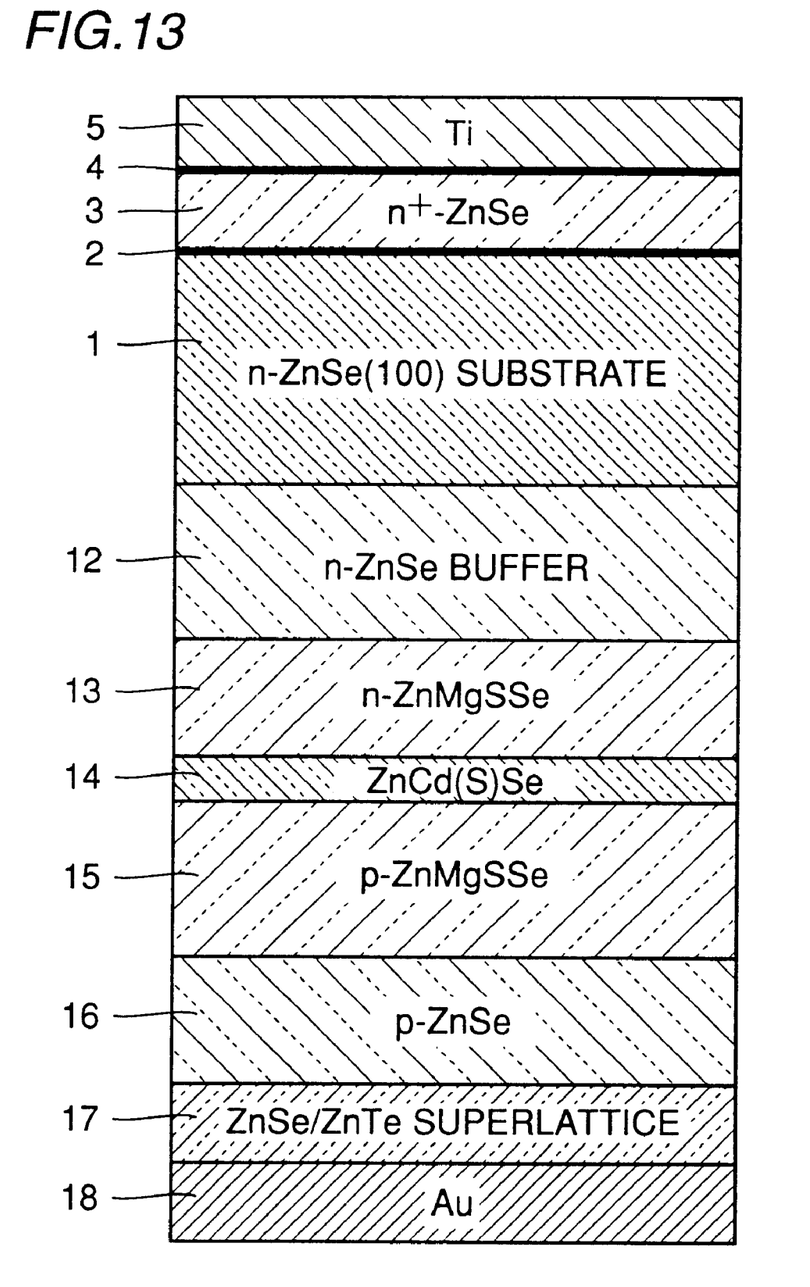
FIG. 13 is a sectional view showing a stage of forming a Ti film on the $n^+$-type ZnSe epitaxial film in the state shown in FIG. 13.

(7) Thereafter the aforementioned n-type ZnSe substrate was moved into the MBE apparatus 33 through the ultrahigh vacuum transfer path 31 in the apparatus shown in FIG. 2. A radical hydrotreatment (second cleaning step) was carried out on the n-type ZnSe substrate subjected to hydrogen chloride etching with the radicalization gun provided in the MBE apparatus 33. Conditions for the radical hydrotreatment are as follows:

hydrogen pressure: $1 \times 10^{-5}$ Torr radicalization power: 100 W substrate temperature: 225° C.

treatment time: 20 minutes (8) Thereafter an n$^+$-type ZnSe film 3 having a high carrier concentration was epitaxially grown in the MBE apparatus 33 with the MBE apparatus as shown in FIG. 12. In this film forming step, the n-type ZnSe substrate cleaned through the aforementioned first and second cleaning steps were simultaneously irradiated with beams of Zn, Se and ZnCl$_2$. The conditions for epitaxially growing the n$^+$-type ZnSe film 3 are as follows:

substrate temperature: 220° C.

thickness of n$^+$-type ZnSe film: 200 nm n-type impurity concentration: $5 \times 10^{19}/cm^3$ (9) Thereafter the aforementioned n-type ZnSe substrate was introduced into the deposition apparatus 34 through the ultrahigh vacuum transfer path 31. As shown in FIG. 13, a Ti film 5 was formed on the n$^+$-type ZnSe film by 50 nm. Then, an Au film was deposited on this Ti film 5 by 50 nm, for obtaining an LED similar to that shown in FIG. 1.

(10) When measuring an operating voltage causing light emission in the LED fabricated through the aforementioned method, it was possible to obtain white light from the LED at a low value of 2.6 V. This is because it was possible to provide an electrode of ohmic contact having a low contact potential on the back surface of the n-type ZnSe substrate.

When applying this LED to the backlight of a liquid crystal display unit of a portable terminal such as a portable telephone, the number of necessary batteries can be reduced due to a low operating voltage and hence the commercial value of the portable telephone or the like can be increased. The aforementioned method of forming an electrode of ohmic contact on the back surface of an n-type ZnSe substrate, which is remarkably simple and can be readily carried out in the aforementioned fabrication apparatus, is suitable for mass production. Therefore, the compound semiconductor device can be fabricated in high efficiency with a high yield, to contribute to introduction of a low-priced LED having high performance into the market.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a compound semiconductor device comprising a substrate cleaning step including:

a first cleaning step of heating a compound semiconductor substrate containing a first conductivity type impurity in a temperature range of not more than 250° C. and etching a surface of said substrate with hydrogen chloride at a temperature of not more than 250° C., so that chlorine adheres onto said surface; and a second cleaning step of performing a radical hydrotreatment on said compound semiconductor substrate that has been etched with said hydrogen chloride and that has said chlorine adhered on said surface, with said surface of said substrate being at a temperature of not more than 250° C., to remove said chlorine from said surface, after said first cleaning step.

2. The method of fabricating a compound semiconductor device according to claim 1, further comprising:
a compound semiconductor film forming step of epitaxially growing a compound semiconductor film containing said first conductivity type impurity in a higher concentration than said compound semiconductor substrate on said compound semiconductor substrate after said substrate cleaning step, and
a conductive electrode film forming step of forming a conductive electrode film on said compound semiconductor film.

3. The method of fabricating a compound semiconductor device according to claim 2, carrying out treatments in said second cleaning step, said compound semiconductor film forming step and said conductive electrode film forming step within such a temperature range that the temperature of said compound semiconductor substrate is not more than 250°C.

4. The method of fabricating a compound semiconductor device according to claim 2, wherein treatments in said substrate cleaning step, said compound semiconductor film forming step and said conductive electrode film forming step are continuously carried out without exposing said compound semiconductor substrate to the atmosphere.

5. The method of fabricating a compound semiconductor device according to claim 2, wherein treatments in said substrate cleaning step, said compound semiconductor film forming step and said conductive electrode film forming step are carried out in respective treatment chambers of a treatment apparatus having a plurality of treatment chambers coupled with each other by an ultrahigh vacuum transfer path respectively without exposing said compound semiconductor substrate to the atmosphere between said treatments.

6. The method of fabricating a compound semiconductor device according to claim 1, wherein said first cleaning step is carried out under conditions of (a) gas components of 5 to 20 volume % of HCl and a rest of He gas, and (b) gas pressure of $1 \times 10^{-6}$ Torr to $1 \times 10^{-4}$ Torr.

7. The method of fabricating a compound semiconductor device according to claim 1, wherein said radical hydrotreatment in said second cleaning step is carried out under conditions of (a) hydrogen pressure of $5 \times 10^{-7}$ Torr to $5 \times 10^{-4}$ Torr, and (b) radicalization power of 50 to 300 W.

8. The method of fabricating a compound semiconductor device according to claim 2, wherein said compound semiconductor substrate is an n-type ZnSe substrate containing an n-type impurity of at least $1 \times 10^{17}/cm^3$, said compound semiconductor film is an n$^+$-type ZnSe film containing an n-type impurity of at least $1 \times 10^{19}/cm^3$, and said conductive electrode film has a Ti film in contact with said n$^+$-type ZnSe film and a protective film protecting said Ti film.

9. An apparatus for fabricating a compound semiconductor device comprising a substrate cleaning arrangement including:
a first cleaning means for etching with hydrogen chloride a surface of a compound semiconductor substrate containing a first conductivity type impurity while heating said compound semiconductor substrate in a temperature range of not more than 250° C., so that chlorine adheres onto said surface; and
a second cleaning means for performing a radical hydrotreatment on said compound semiconductor substrate of which said surface has been etched with hydrogen chloride by said first cleaning means and has chlorine adhered thereon, at a temperature of not more than 250° C., to remove said chlorine from said surface.

10. The apparatus for fabricating a compound semiconductor device according to claim 9,
wherein said first cleaning means comprises a gas treatment apparatus adapted to perform gas etching on said compound semiconductor substrate;
wherein said second cleaning means comprises a radical treatment apparatus adapted to perform a radical treatment on said compound semiconductor substrate;
and further comprising:
a film formation treatment apparatus adapted to form a compound semiconductor film on said compound semiconductor substrate;
a conductive film forming apparatus adapted to form a conductive film on said compound semiconductor substrate; and
an ultrahigh vacuum transfer path coupled respectively with said gas treatment apparatus, said radical treatment apparatus, said film formation treatment apparatus and said conductive film forming apparatus to be capable of transferring said compound semiconductor substrate.

11. The apparatus for fabricating a compound semiconductor device according to claim 10, having an MBE (molecular beam epitaxy) apparatus serving both as said radical hydrotreatment apparatus and said film formation treatment apparatus, wherein said MBE apparatus includes a Zn cell, an Se cell, a ZnCl$_2$ cell, a hydrogen gas supply source and a radicalization gun for performing a radical hydrotreatment on said compound semiconductor substrate with said hydrogen gas supply source and said radicalization gun and forming an n-type ZnSe film on said compound semiconductor substrate with said Zn cell, said Se cell and said ZnCl$_2$ cell.

12. The apparatus for fabricating a compound semiconductor device according to claim 10, wherein said conductive film forming apparatus is adapted to form at least one of a Ti film and an Au film on said compound semiconductor substrate.

13. A method of fabricating a compound semiconductor device comprising the following steps:
a) providing a compound semiconductor substrate containing a first conductivity type impurity and having opposite first and second surfaces;
b) heating and etching said first surface of said substrate with hydrogen chloride in a temperature a range of not more than 250° C., wherein chlorine is left remaining on said first surface upon ending said etching; and
c) after said step b), subjecting said first surface to hydrogen radicals in a temperature range of not more than 250° C. to remove at least some of said chlorine left remaining on said first surface upon ending said etching of said step b).

14. The method according to claim 13, wherein said substrate provided in said step a) has oxides on said first surface, and said etching of said step b) removes at least some of said oxides on said first surface.

15. The method according to claim 13, wherein said first surface is a back surface on which a backside electrode is to be provided and said second surface is a front surface of said substrate.

16. The method according to claim 15, further comprising a step of providing at least one active layer on said second surface, before said step b).

17. The method according to claim 15, further comprising, after said step c), the following additional steps:
d) epitaxially growing on said first surface a compound semiconductor film containing said first conductivity type impurity at a concentration higher than that of said first conductivity type impurity in said substrate; and e) forming a conductive metal electrode film on said compound semiconductor film.

18. The method according to claim 17, wherein said steps d) and e) are performed with said substrate in a temperature range of not more than 250° C.

19. The method according to claim 17, wherein said steps b), c), d) and e) are carried out in direct succession without exposing said substrate to the atmosphere.

20. The method according to claim 17, wherein said conductive metal electrode film comprises at least one of Ti and Au.

21. The method according to claim 17, wherein said compound semiconductor substrate is, an n-type ZnSe substrate, said compound semiconductor film is an $n^+$-type ZnSe film, and said conductive metal electrode film does not comprise In.

* * * * *